United States Patent [19]
Duell et al.

[11] Patent Number: 4,742,864
[45] Date of Patent: May 10, 1988

[54] PASSIVE VENTILATED CONTROL BOX

[75] Inventors: Richard J. Duell, Syracuse; Derrick A. Marris, Blossvale; John M. Palmer, Syracuse; Anthony P. Sardina, Jr., Clay, all of N.Y.

[73] Assignee: Carrier Corporation, Syracuse, N.Y.

[21] Appl. No.: 920,395

[22] Filed: Oct. 20, 1986

[51] Int. Cl.⁴ .................... F25B 49/00; H02B 9/00
[52] U.S. Cl. ............................... 165/1; 165/47; 165/122; 361/384; 174/16 R; 62/507
[58] Field of Search ............... 361/384; 62/507, 508; 174/16 R; 165/47, 122, 80.3

[56] References Cited

U.S. PATENT DOCUMENTS

| | | | |
|---|---|---|---|
| 2,859,270 | 11/1958 | Patchin | 174/16 R |
| 3,407,869 | 10/1968 | Staunton | 165/80.3 |
| 4,027,206 | 5/1977 | Lee | 165/80.3 |
| 4,142,091 | 2/1979 | Biethan, Jr. | 361/384 |
| 4,237,521 | 12/1980 | Denker | 165/122 |
| 4,616,693 | 10/1986 | Dietzsch et al. | 165/80.3 |
| 4,628,992 | 12/1986 | Kennedy | 165/80.3 |

FOREIGN PATENT DOCUMENTS

| | | | |
|---|---|---|---|
| 1165708 | 1/1958 | Fed. Rep. of Germany | 174/16 R |
| 0110837 | 8/1980 | Japan | 165/64 |
| 0182042 | 10/1983 | Japan | 361/384 |

Primary Examiner—Albert W. Davis, Jr.
Assistant Examiner—John K. Ford
Attorney, Agent, or Firm—Dana F. Bigelow

[57] ABSTRACT

An electronic control box is provided with an internally disposed vent channel which carries ambient air from a bottom opening to the top portion of the control box. The cooling air is then caused to flow downwardly through the control box and over the electronic components by way of a bottom opening which is fluidly connected by a vent tube to a negative pressure area created by the fan. The flow of cooling air through the control box is therefore promoted while maintaining the water-tight integrity of the box.

10 Claims, 1 Drawing Sheet

PASSIVE VENTILATED CONTROL BOX

BACKGROUND OF THE INVENTION

This invention relates generally to air conditioning systems and, more particularly, to a method and apparatus for cooling the electronic components of the control box therefor.

The controls for regulating the operation of air conditioning systems are customarily isolated in a control box which is located on or near the equipment. For example, there is normally a control box associated with the outdoor fan apparatus in an air conditioning or heat pump system. The components within these control boxes have traditionally been quite simple and generated very little heat. Accordingly, there was no need to make any provision for cooling those components.

In the development of a more advanced design of air conditioning equipment, the applicants have found that as more sophisticated electronics are added to the controls, significantly greater amounts of heat are generated. For example, in an inverter controlled variable speed system, the relatively large transistors that are included tend to dissipate a substantial amount of heat. Further, there are other related components which tend to give off more heat than the conventional electromechanical control systems.

One method which the applicants have found satisfactory for dissipating the generated heat is the use of a heat sink attached to one side of the control box. Although such a heat sink is helpful in enhancing the dissipation of generated heat, there are certain components which cannot be attached to the heat sink since they must necessarily be electrically isolated. Thus, the normal convection process and the supplementary use of the heat sink, are not sufficient to dissipate the total amount of heat generated by the components.

A further complication in the cooling of electronic components within a control box is that of the need to protect the components from exposure to moisture. That is, not only is one precluded from the use of ventilating holes in the control box, but it is further necessary to seal any other openings in the control box against the entry of moisture from rain or snow to which the outer side is exposed.

It is therefore an object of the present invention to provide an improved control box for air conditioning systems.

Another object of the present invention is the provision for additional cooling to the electronic components in an air conditioning control box.

Yet another object of the present invention is the provision for enclosing and cooling the electronic components of a control box while at the same time maintaining electrical isolation thereof.

Still another object of the present invention is the provision for cooling the electronic components of a control box while maintaining the watertight integrity of the box.

Yet another object of the present invention is the provision for an economical and extremely useful method and apparatus for cooling an electronic control box for an air conditioning system.

These objects and other features and advantages become more readily apparent upon reference to the following description when taken in conjunction with the appended drawings.

SUMMARY OF THE INVENTION

Briefly, in accordance with one aspect of the invention, a conduit is vertically disposed within the control box with its lower end having its opening exposed to the ambient air, and with its upper end being opened to the upper portion of the control box for introducing cooling air thereto. Located near the bottom of the control box is a conduit which extends from the bottom portion of the control box, through one side thereof, to a negative pressure area created by an operating fan. The negative pressure acting on the lower conduit causes the cooling air to pass up the vertical conduit, vertically down the control box to thereby cool the contained electronic components, and through the lower conduit to the negative pressure area.

In the drawings as hereinafter described, a preferred embodiment is depicted. However, various other modifications and alternate constructions can be made thereto without departing from the true spirit and scope of the invention.

DESCRIPTION OF THE PREFERRED EMBODIMENT

Figure 1:
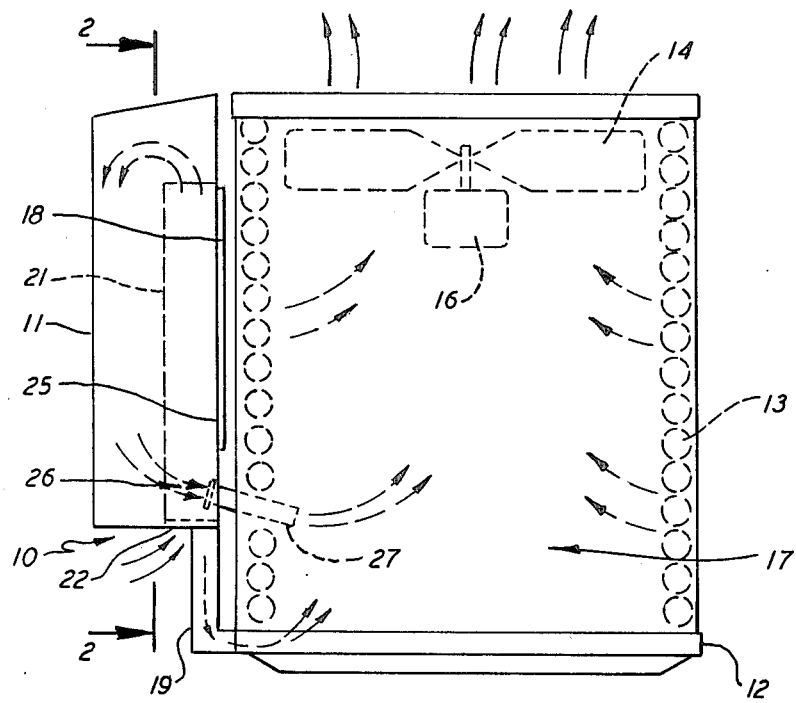
FIG. 1 is a side elevational view of an outdoor coil with a control box attached in accordance with the present invention.
Figure 2:
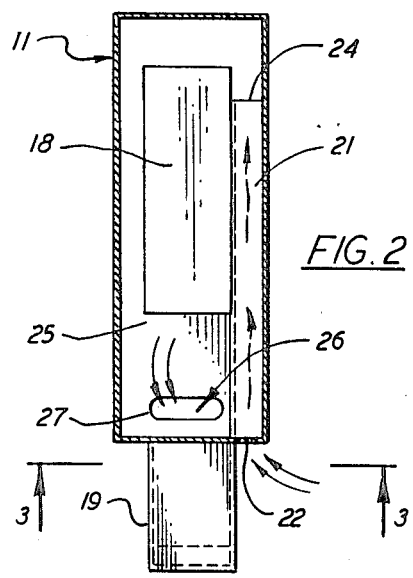
FIG. 2 is a sectional view of the control box portion thereof as seen along lines 2—2 in FIG. 1.
Figure 3:
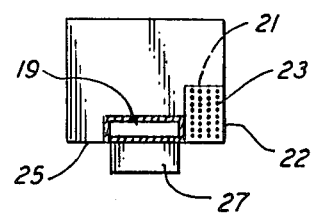
FIG. 3 is a bottom view of the control box portion of the invention as seen along lines 3—3 of FIG. 2.

Referring now to FIG. 1, the invention is shown generally at 10 as incorporated into a control box 11 which is attached to the outer side of an outdoor coil assembly 12. The outdoor coil assembly 12 includes a vertically extending cylindrical coil 13 and an axial fan 14 with its driving motor 16 mounted at the top end of the coil 13. During periods of fan operation, air is drawn in from the outside air to pass through the coil 13 and to exit upwardly through the fan as shown by the arrows. It will therefore be recognized that a negative pressure is created in the area 17 below the fan. This negative pressure is used in promoting the flow of cooling air through the control box 11 as will be described hereinafter.

Associated with the control box 11 is a heat sink 18 which is mounted on the rear side of the control box, so as to be disposed between the control box and the outdoor coil assembly 12 as shown. On the control box side of the heat sink 18, certain of the electronic components are thermally attached to the heat sink 18 so as to dissipate their heat thereto. The electronic components are not shown in the drawings for sake of clarity in describing the structure of the present invention, it being understood that the particular configuration and arrangement of the electronic components is in no way critical to the present invention. Suffice it to say, the electronic components are mounted within the control box 11, with a portion being thermally attached to the heat sink.

The electronic controls are electrically connected to the fan motor 16 by way of wires passing through the bottom wall of the control box 11, through a raceway 19 and into the outdoor coil assembly 12.

Mounted within the control box 11 is a vent channel 21 which extends vertically upward from the lower end of the control box to a point near the top end thereof.

The bottom end 22 of the vent channel 21 has a plurality of holes 23 formed therein for allowing the entry of ambient air into the vent channel 21. The top end 24 of the vent channel 21 is open to permit the flow of air through the vent channel 21 as shown by the arrows. Since the vent channel 21 is entirely within the control box 11, with the only opening to the outside being the bottom end 22 which is located in a somewhat protected position at the inner edge of the control box 11, the integrity of the control box 11 against entry of rain and snow is maintained.

Formed in the inner wall 25 of the control box 11 is an opening 26 into which a vent tube 27 is placed, with the vent tube extending from the bottom portion of the control box, through the opening 26 and the coil 13, and into the negative pressure area 17, to thereby provide a flow path for the coolant air flowing from the bottom of the control box 11 to the negative pressure area 17. The negative pressure within the area 13 therefore acts on the vent tube 27 so as to cause the coolant air to flow into the channel bottom end 22, up through the vent channel 21 into the top portion of the control box 11, down through the control box and over the electronic components to be cooled, and through the vent tube 27 to the negative pressure area 17.

As shown in FIG. 1, there will be some air flowing within the wire raceway 19 as indicated by the arrows. However, it should be recognized that all of the cooling air that enters the control box 11 (i.e., that air entering the channel bottom end 22), must travel upwardly the length of the control box 11 and then return downwardly the length of the control box before it exists the control box. Accordingly, because of the structure of the vent channel 21, there is no short circuiting of the coolant air from its point of entrance into the control box directly to the negative pressure area 17.

It should also be recognized that, since all of the openings in the control box are at the bottom end thereof, the requirements for sealing are minimized. That is, since both the channel bottom end 22 and the opening for the wire raceway 19 are in the bottom wall, no moisture will enter the control box by way of those openings. Although the vent tube and its associated opening 27 is located above the control box bottom wall, and therefore may have some moisture enter therein, it is still located below all of the electronic components and therefore will not cause any damage even if leakage does occur.

It will be understood that the present invention has been described in terms of a preferred embodiment, but may take on any number of other forms while remaining within the scope and intent of the invention.

What is claimed is:

1. In a heat exchange apparatus of the type having a coil assembly and a fan for drawing air radially inwardly through the coil, an improved electronic control box comprising:
   a box attached to the coil assembly and containing electronic components for controlling the heat exchange apparatus, said box having a first opening in the bottom thereof for receiving the flow of cooling air therein;
   a channel disposed within said box and fluidly connected to said first bottom opening to provide a conduit for the flow of cooling air to the top portion of said box; and
   a second opening in the bottom of said box, said second opening providing fluid flow communication to a negative pressure area caused by operation of the fan such that cooling air is drawn up said channel to said box top portion, and then to said second bottom opening to thereby cool said electronic components.

2. An electronic control box as set forth in claim 1 wherein said first bottom opening includes a restricting element having a plurality of holes formed therein for the conduct of cooling air therethrough.

3. An electronic control box as set forth in claim 1 wherein said second bottom opening includes a vent tube which extends through the coil to said negative pressure area.

4. An improved control box of the type containing electronic components to control an air conditioning unit and attached thereto, said air conditioning unit having a coil and a fan for circulating air through the coil, comprising:
   a channel disposed within the control box said channel having an inlet opening in one end thereof which is in fluid communication with the ambient air, and an opening in the other end thereof in fluid communication with one end of the control box;
   an outlet opening in the other end of the control box, said outlet opening being in fluid flow communication with said control box one end and being otherwise isolated from fluid flow communication with said channel; and
   a vent channel connected to said outlet opening to provide fluid flow communication between said outlet opening and the negative pressure area created by operation of the fan whereby electronic components contained in said box are ventilated.

5. A control box as set forth in claim 4 wherein said channel inlet opening is located in said control box other end.

6. A control box as set forth in claim 4 wherein said channel inlet opening is located at the bottom end of the control box.

7. A control box as set forth in claim 4 wherein said outlet opening is located at the bottom end of the control box.

8. A method of providing ventilation to a control box of the type having electronic components therein for controlling the operation of an associated air conditioning apparatus including a coil and a fan, comprising the steps of:
   providing an inlet opening in one end of the control box for the entry of cooling air therein;
   providing a channel for the flow of cooling air from said inlet opening to the other end of the control box;
   providing an outlet opening in said control box one end for the flow of cooling air out of the control box, while otherwise maintaining fluid flow isolation between said inlet opening and said outlet opening; and
   creating a negative pressure at said outlet opening to thereby cause a flow of cooling air into said inlet opening, through said channel to said control box other end, through said control box to said control box one end, and out said outlet opening.

9. A method as set forth in claim 8 wherein said inlet opening is provided in the bottom of the control box.

10. A method as set forth in claim 8 wherein said step of creating a negative pressure is accomplished by way of the fan drawing air through the coil.

* * * * *